(12) United States Patent
Stutts et al.

(10) Patent No.: US 6,231,356 B1
(45) Date of Patent: May 15, 2001

(54) GROUNDING CLIP FOR COMPUTER PERIPHERAL CARDS

(75) Inventors: Jim Stutts, Garner; Frederic Kozak, Raleigh; Jim Korzik, Apex; Scott Eastman, Cary, all of NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/409,351

(22) Filed: Sep. 30, 1999

(51) Int. Cl.[7] .................. H01R 13/648; H01R 4/66; H01R 12/00; H05K 1/00
(52) U.S. Cl. ................. 439/92; 439/76.1; 439/607; 439/939
(58) Field of Search .................. 439/76.1, 946, 439/95, 607, 92, 609, 939; 361/737

(56) References Cited

U.S. PATENT DOCUMENTS 4,738,637 * 4/1988 Asick et al. ............... 439/610
5,893,766 * 4/1999 Bellas et al. .............. 439/95
5,940,275 * 8/1999 Laity ........................ 361/737
6,008,994 * 12/1999 Bates ....................... 361/737

* cited by examiner

Primary Examiner—Paula Bradley
Assistant Examiner—Edwin A. León
(74) Attorney, Agent, or Firm—Christopher J. Palermo; Carina M. Tan; Hickman Palermo Truong & Becker LLP

(57) ABSTRACT

A grounding clip for computer peripheral cards includes a base and at least one finger. The base has a contact surface and contains an aperture. Further, the aperture is sized to receive the particular peripheral card that must be discharged by the grounding clip. The finger extends from an internal length portion of the base, and in the case where a plurality of fingers are provided, they paired and disposed in registry along opposing internal length portions of the base. Each finger includes a discharge surface for contacting and grounding the peripheral card.

9 Claims, 5 Drawing Sheets

GROUNDING CLIP FOR COMPUTER PERIPHERAL CARDS

BACKGROUND OF THE INVENTION

1. Technical Field

The present invention relates to packaged electronic assemblies, and, more particularly, to a grounding clip for computer peripheral cards.

2. Description of the Related Art

Electronic devices such as computers, laptops, personal digital assistance (PDA's), etc. utilize various types of interfaces in order to exchange data and expand their capabilities. For example, personal computers utilize parallel, serial, and bus interfaces to connect to external devices and exchange data. Bus interfaces often take the form of a slot connected to a printed circuit board that contains electrical contacts, and are sized to receive peripheral cards designed to meet specific standards. Examples of such standards include the Industry Standard Architecture (ISA), the Peripheral Component Interconnect (PCI), and the Personal Computer Memory Card International Association (PCMCIA).

The PCMCIA standard has been extensively refined to provide the requirements for accommodating a variety of device types on the basic peripheral card format. Some of the devices that can be accommodated on the PCMCIA peripheral card include random access memory (RAM), EEPROMs, hard disk drives, fax/modems, etc. PCMCIA cards are relatively small in size, hence lending to popularity for use with laptops, PDA's, etc.

Peripheral cards, such as PCMCIA cards, can be constructed in various ways. A typical PCMCIA card includes a printed circuit board (PCB) containing various types of electronic components mounted thereon. For example, various controller chips or a central processing unit (CPU) chip can be mounted on the PCB. In addition, the PCB may include integrated circuitry formed thereon as part of a fabrication process. The PCB is subsequently encased within a protective metal cover. The protective metal cover includes an edge that contains a plurality of female electrical connectors. Electronic devices that receive PCMCIA cards include corresponding male connectors that establish an electrical connection between the PCMCIA card and the electronic device. Peripheral cards such as PCI and ISA cards, however, are constructed such that only the edge connectors that will subsequently be in contact with the electronic device, are exposed.

One of the major problems encountered in manufacturing and handling peripheral cards is the build-up of electrical charges on the PCB. For example, during the manufacturing process, the peripheral card must be handled and carried on multiple occasions. During this process an electrical charge is generated and built up on the peripheral card. The amount of charge generated and built up depends on the amount of handling and the environment in which the peripheral card is handled. Consequently, a peripheral card can be packaged and sold while bearing an electrical charge thereon. When the peripheral card is inserted into the host device (i.e. the computer or PDA), the charge flows into the host device through the edge connectors. Since the edge connectors are in direct electrical communication with various components in the host device, the discharge of electrical energy from the peripheral card can cause significant damage to the circuit, which can, on occasions, lead to failure of the host device.

The discharge of electrical energy from the peripheral card to the device can be eliminated, for example, by grounding the peripheral card prior to contacting it with the device. This has been typically accomplished by providing a conductive grounding clip on the peripheral card for purposes of engaging an appropriate grounding circuit on the device. For example, the PCMCIA standard provides for grounding clips at a fixed location along the side edge of the peripheral card. Such an arrangement, however, requires additional parts and increases manufacturing costs in order to properly route the requisite number of traces to the grounding edge of the peripheral card.

Accordingly, one disadvantage associated with current peripheral cards is the inadvertent build-up of electrical charges that can potentially destroy circuitry on the host device that will receive the peripheral card. Another disadvantage associated with current peripheral cards is the extended manufacturing steps traditionally required to properly provide a grounding point.

DISCLOSURE OF THE INVENTION

An advantage of the present invention is the ability to easily discharge a peripheral card prior to electrically contacting the host device in which it will be inserted.

This and other advantages are achieved by present invention wherein a grounding clip contacts a peripheral card prior to electrical connection with a host device in order to direct any charge that has been built up on the peripheral card to a grounding point.

In accordance with one aspect of the invention, a grounding clip for a peripheral card comprises a base and at least one plurality of finger. The base includes a contact surface and contains an aperture that is defined by an internal length portion and an internal width portion thereof. Further, the aperture is appropriately sized and configured to receive the particular peripheral card that must be discharged by the grounding clip. The at least one finger extends from one of the internal length portions of the base. Each finger includes a discharge surface for contacting and grounding the peripheral card. Further, according to one embodiment of the invention, the plurality of fingers can be paired and disposed in registry along opposing internal length portions of the base.

The present invention advantageously provides the ability to discharge a peripheral card prior to connection with the host device. This is accomplished by using the discharge surface of the fingers to direct any charge that has been built up on the peripheral card to a low impedance, high frequency grounding point. Hence, damage to the circuitry of the host device, as a result of electrical discharge from the peripheral card, is eliminated.

Additional advantages and novel features of the present invention will be set forth in part in the description which follows, and in part will become apparent to those skilled in the art upon examination of the following, or may be learned by practice of the present invention. The embodiments shown and described provide an illustration of the best mode contemplated for carrying out the present invention. The advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATIVE EMBODIMENTS

Figure 1:
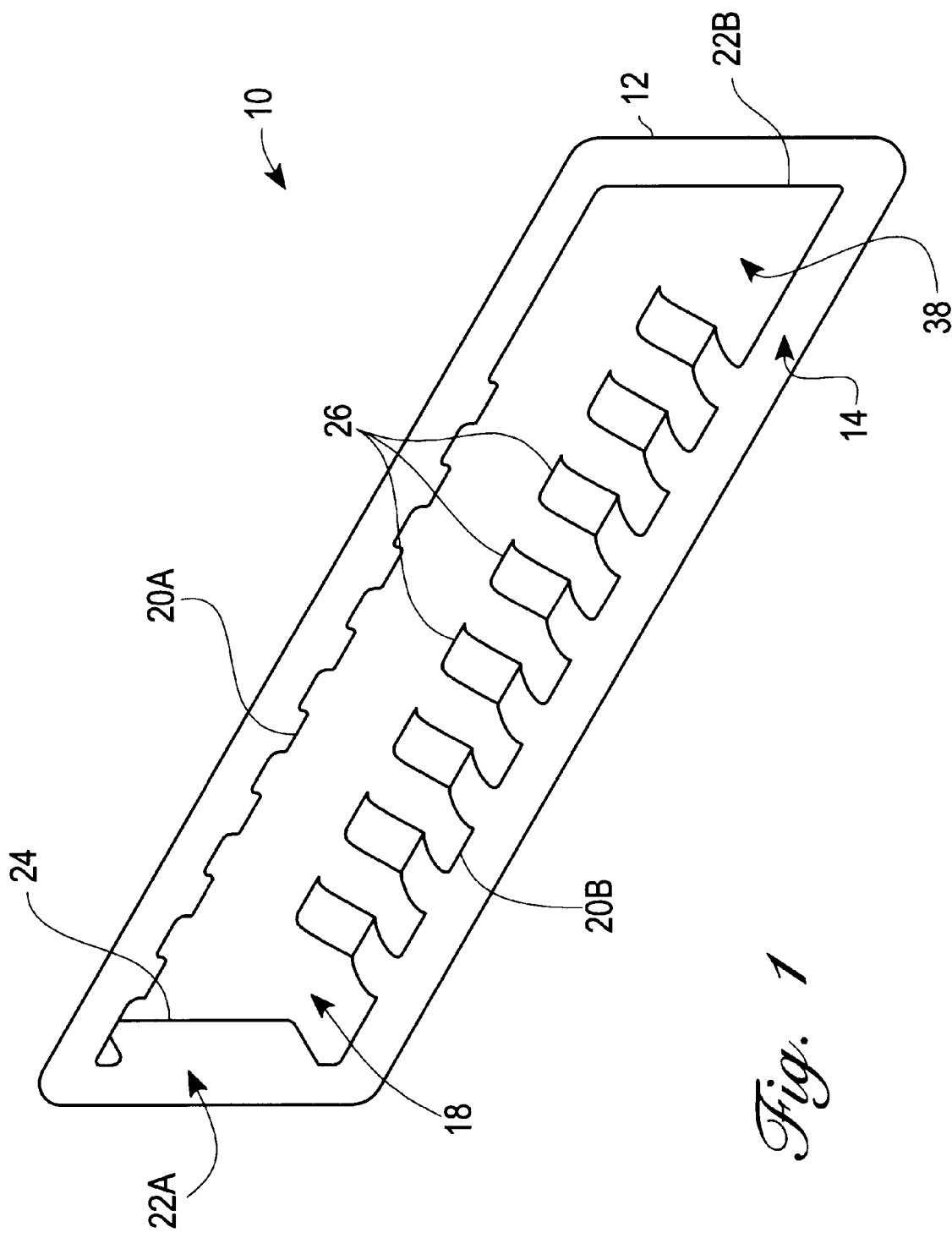
FIG. 1 is a perspective view of a grounding clip constructed in accordance with an embodiment of the present invention.
Figure 2:
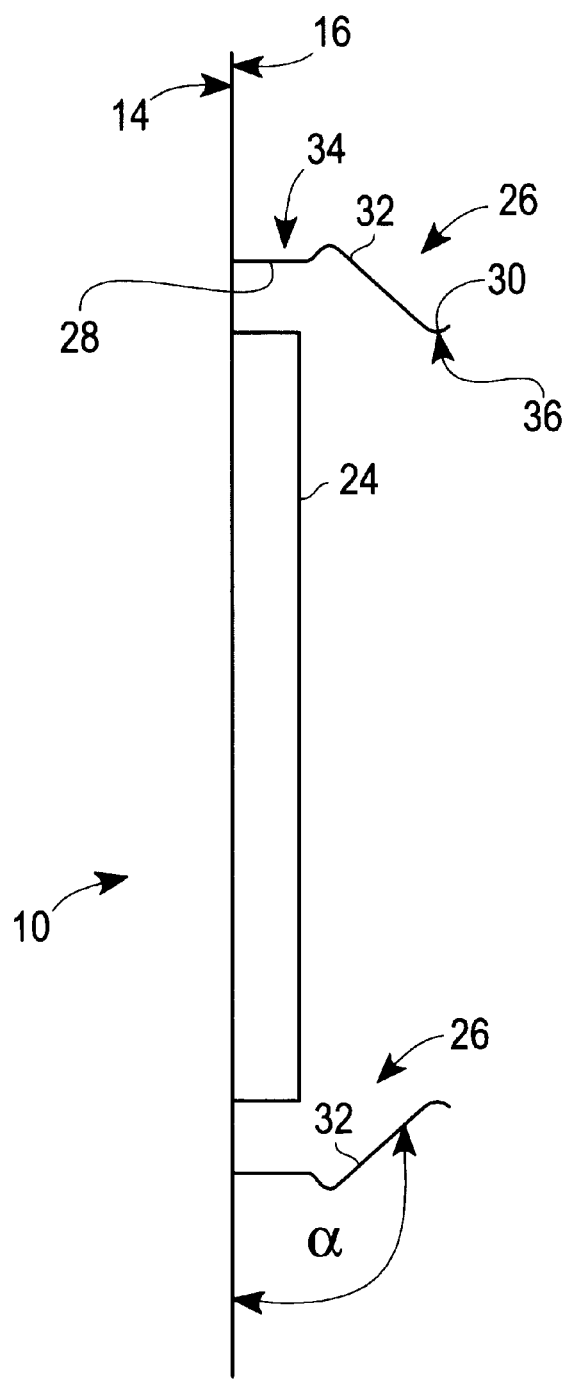
FIG. 2 is a side elevational view of the grounding clip of FIG. 1.

An embodiment of the present invention is schematically illustrated in FIGS. 1–4, wherein similar features and parts bear similar reference numerals. Referring initially to FIG. 1, a grounding clip 10 for a peripheral card is shown. The grounding clip 10 is in the form of a base 12 having a generally rectangular shape. The base 12 of the clip includes a rear surface 14 and, as best seen in FIG. 2, a contact surface 16. The grounding clip 10 contains an aperture 18 that is defined by internal length portions 20A, 20B (collectively 20) and internal width portions 22A, 22B (collectively 22) of the base 12.

As illustrated in FIG. 1, the aperture 18 also has a rectangular configuration. While not explicitly shown, the aperture 18 is appropriately sized to receive the specific peripheral card that will be discharged by the grounding clip. Such a card can, for example, be a PCMCIA card. A pair of alignment tabs 24 is formed along the internal width portions 22 of the grounding clip 10. As seen in FIGS. 1 and 2, each alignment tab 24 is in the form of an extension from the base 12 of the grounding clip 10. The extensions are bent at approximately 90° angles (i.e., generally perpendicular) relative to the rear surface 14 and contact surface 16 of the grounding clip 10. The alignment tabs 24 function to locate the grounding clip 10 within a cut-out of a mounting bracket of a host device, and prevent lateral movement of the grounding clip 10.

Figure 3:
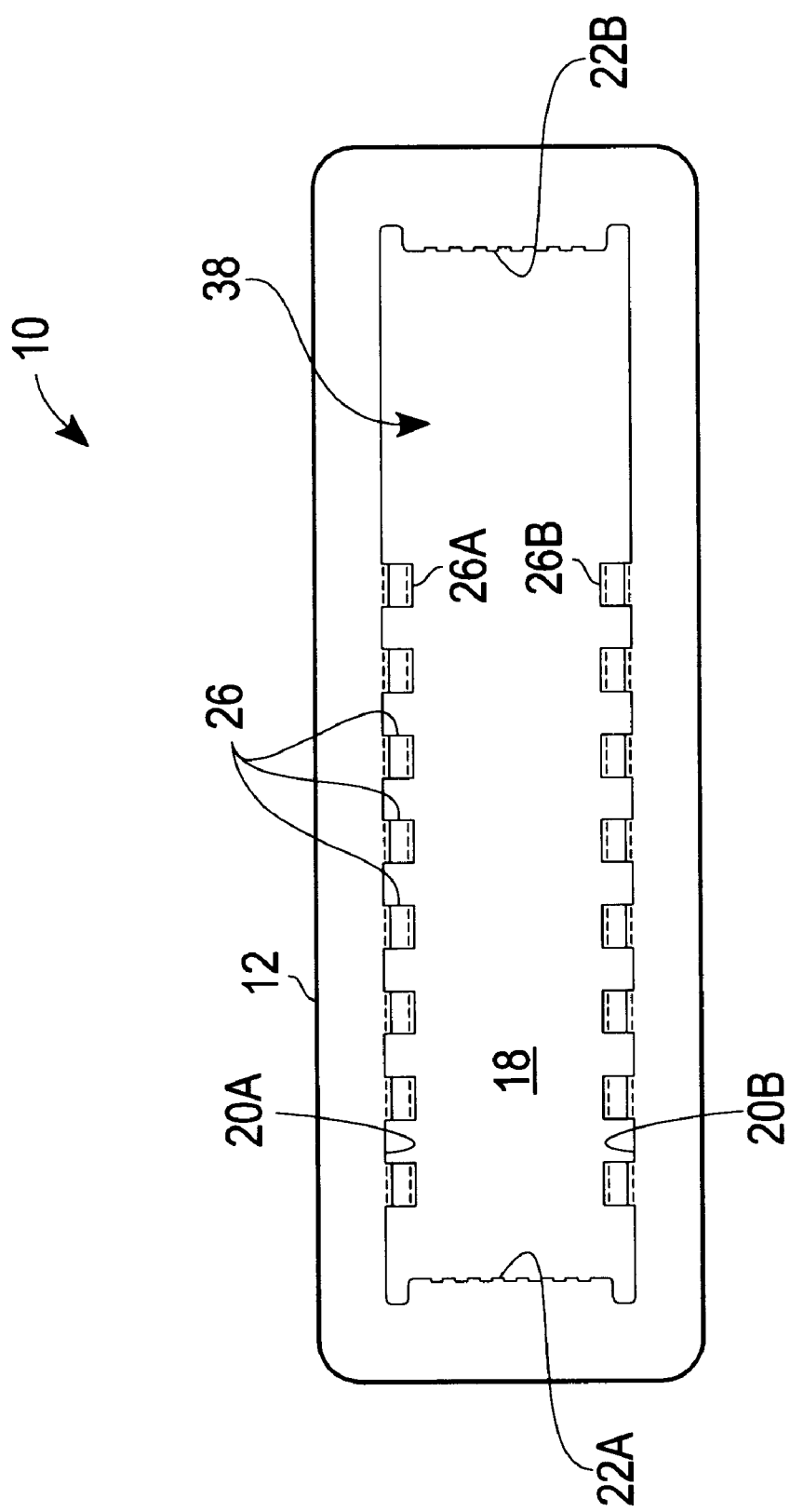
FIG. 3 is a front elevational view thereof.
Figure 4:
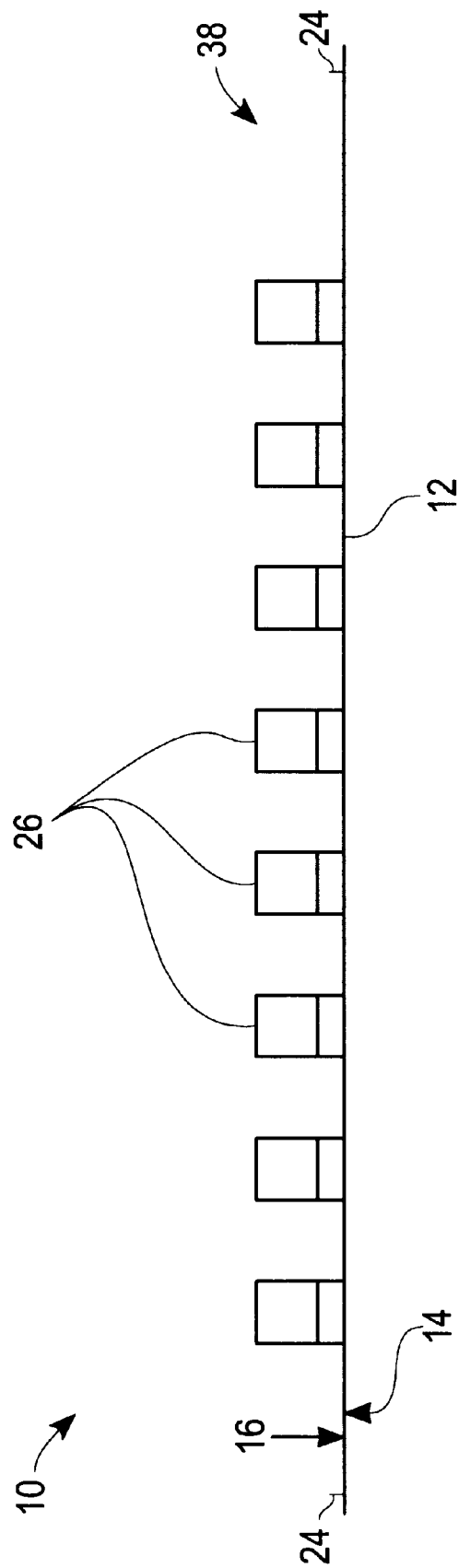
FIG. 4 is a top plan view thereof.

A plurality of fingers 26 extends along each internal length portion 20 of the grounding clip 10. As shown in FIGS. 2 and 3, the plurality of fingers 26 are paired and disposed in registry along opposing internal length portions 20A, 20B of the grounding clip 10. Each finger 26 is generally flat and includes a first end 28, a second end 30, and an intermediate portion 32. The first end 28 of each finger 26 extends from the base 12 of the grounding clip 10, while the second end 30 is unattached. Although a plurality of fingers 26 is illustrated in FIGS. 1–4, it should be noted that only one finger 26 is required for grounding the peripheral card.

Referring to FIG. 2, the first end 28 contains an alignment groove 34 that is formed by extending the first end 28 from the base 12 of the grounding clip 10 in a generally perpendicular manner for a prescribed distance, and again bending the first end 28 to form the alignment groove 34. The particular configuration of the alignment groove 34 allows the grounding clip 10 to be self-retaining when mounted into the cut-out of the mounting bracket. Accordingly, the size of the alignment groove 34 can vary depending on the thickness of the mounting bracket.

With continued reference to FIG. 2, it can be seen that, subsequent to forming the alignment groove 34, the finger 26 is bent at a prescribed angle α to define the intermediate portion 32. The prescribed angle α is selected for positioning the finger 26 in contact with the peripheral card. Accordingly, the exact value of the angle α selected can vary depending on the type of peripheral card that will be used. In general, an angle α ranging from about 120° to about 150° should be sufficient for positioning the finger 26 in contact with the peripheral card. Preferably, the angle can be selected to be about 135° in order to accommodate various types of PCMCIA cards (e.g., types 1, 2, or 3).

The second end 30 of the finger 26 is outwardly curved to define a discharge surface 36 that will contact the peripheral card. The curve prevents the possibility that an edge of one of the fingers 26 may contact and inadvertently damage the peripheral card as it is being inserted through and/or removed from the grounding clip 10. Further, the fingers 26 are resiliently biased such that inserting a peripheral card between a pair fingers 26 initiates contact along the curve of the second end 30 to expand the fingers 26 so that the discharge surface 36 will contact the peripheral card and discharge any electrical charge that may have been stored on the peripheral card.

As shown in FIGS. 1 and 3, the grounding clip 10 also includes an eject port section 38 within the aperture 18. More particularly, the eject port section 38 is defined by one of the internal width portions 22B and a pair of fingers 26A, 26B. The eject port section 38 is particularly advantageous for grounding clips 10 that will be used with PCMCIA connectors. As is well known, such connectors often include an eject button on one side thereof. The eject button generally does not come into contact with the peripheral card, and only provides a function of allowing a user to manually eject a device such as a removable disk. Further, the grounding clip 10 is designed such that it can be reversed, thereby allowing use with PCMCIA cards having an eject button positioned on either the left side or right side thereof.

As previously stated, the grounding clip 10 of the present invention provides a conductive path to a point of low impedance (i.e., such as a ground point) away from the electronic circuitry of the host device. Accordingly, the grounding clip 10 should be constructed from highly conductive materials. For example, metal conductors, including copper and its alloys, are capable of providing a sufficiently conductive path to discharge the peripheral card. Further, the material used to construct the grounding clip 10 should be strong, resilient, and malleable. It is recognized that beryllium-copper alloys provide all of the aforementioned properties. Hence, beryllium-copper alloys can function as ideal materials for constructing the grounding clip 10.

There are numerous other materials capable of providing the properties required of the grounding clip 10. For example, conductively filled polymers such as a silicon-based material having an electric fill substance can be used. Such electrical substances are well known in the industry. If a conductively filled polymer is used, then a sheet of material having sufficient rigidity can be used in combination with the polymer to provide the grounding clip 10 with physical properties that are comparable to the properties achievable using, for example, a copper alloy. The grounding clip 10 of the present invention is particularly beneficial when configured for use with a PCMCIA peripheral card. PCMCIA peripheral cards are typically enclosed in a conductive shell. Accordingly, the grounding clip 10 can be designed to contain only one finger 26, or if desired, a plurality of fingers 26. Preferably, the grounding clip 10 contains a plurality of fingers 26 in order to maximize contact with the PCMCIA card, while providing the most effective and efficient grounding effect. Hence, regardless of the orientation at which the PCMCIA card is inserted, the conductive casing (or multiple edge connectors in the case of other types peripheral cards) will come in contact with the fingers 26 of the grounding clip 10. As previously noted, however, even one finger 26 can be sufficient for grounding a peripheral card.

Figure 5:
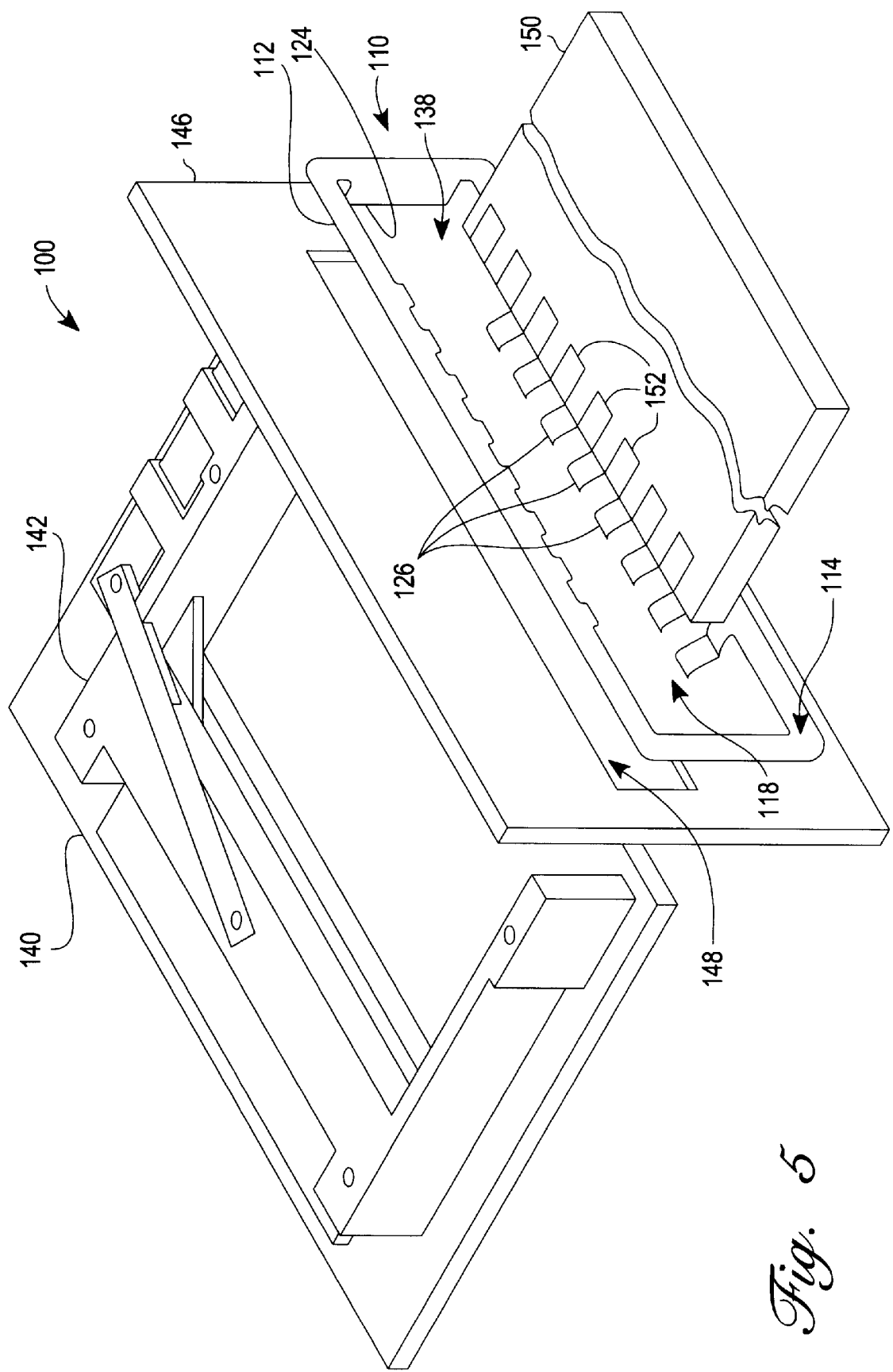
FIG. 5 is a perspective view of a computer peripheral connector incorporating a grounding clip according to the present invention.

FIG. 5 illustrates a computer peripheral connector 100 constructed in accordance with an embodiment of the present invention. The computer peripheral connector 100 incorporates a grounding clip 110, such as that described with reference to FIGS. 1–4, to discharge any electrical charge built up on a peripheral card 150. As previously stated, such a process advantageously reduces damage to the internal circuitry of the host device.

The computer peripheral connector 100 includes a printed circuit board (PCB) 140, a device connector 142, and a mounting bracket 146. The PCB 140 contains circuitry to perform specific functions in conjunction with the peripheral card 150, or to exchange data therebetween. The circuitry contained on the PCB 140 can be in the form of transistors and semiconductor devices formed during a fabrication process. The circuitry can also be in the form of integrated circuit chips that are directly mounted on the surface of the PCB 140. The specific type of circuitry on the PCB 140 will depend on the specific application and specific function of the peripheral card 150.

A device connector 142 is operatively mounted on the PCB 140. The device connector 142 functions as an interface between the PCB 140 and the peripheral card 150, as will be described in greater detail herein below. A mounting bracket 146 is coupled to the PCB 140 and the device connector 142. The mounting bracket 146 is coupled to the PCB 140 such that it is referenced to a low impedance, high frequency ground point. The ground point to which the mounting bracket 146 is referenced can be any grounding point used by the host device, such as, for example, the chassis of a personal computer on a common ground.

A grounding clip 110 is also provided for use with the computer peripheral connector 100. As shown in FIG. 5, the mounting bracket 146 includes a first aperture 148 that is appropriately sized for receiving both the grounding clip 110 and the peripheral card 150.

As shown in FIG. 5, and as previously indicated with respect to FIGS. 1–4, the grounding clip 110 includes a base 112 having a generally rectangular shape, and containing an aperture 118 therethrough. Internal length and internal width portions of the grounding clip 110 define the size and shape of aperture 118. Further, aperture 118 is appropriately sized to receive the peripheral card 150. The grounding clip 110 also includes a contact surface (not shown) and a rear surface 114. A pair of alignment tabs 124 (only one shown) extends from the internal width portions of the grounding clip 110 in a generally perpendicular disposition relative to the surface of the base 112. A plurality of fingers 126 extends from the internal length portions of the base 112 and paired such that they are disposed in registry along opposing internal length portions of the base 112, as previously described with reference to FIGS. 1–4.

With continued reference to FIG. 5 and additional reference to FIG. 2, each finger 126 includes a first end, a second end, and an intermediate portion. The first end of each finger 126 is connected to the grounding clip 110 and contains an alignment groove that is formed by bending the fingers 126 at multiple locations. The alignment groove is sized such that it can accommodate the mounting bracket 146 therein. The second end of each finger 126 contains a curved portion that defines a discharge surface for contacting and grounding the peripheral card 150.

For purposes of illustration, FIG. 5 shows a plurality of edge connectors 152 disposed on the surface of the peripheral card 150. The fingers 126 are positioned to contact the edge connectors 152 and ground the peripheral card 150. As illustrated in FIG. 5, the edge connectors 152 represent an exemplary configuration of a peripheral card such as, for example, a PCI card. It should be noted that such a configuration is merely intended to illustrate the location of the edge connectors 152 relative to the fingers 126, and not intended to accurately represent the structure of either a PCMCIA or PCI card. Accordingly, certain details are used only to simplify understanding of the operation of the grounding clip 110.

The alignment grooves of the fingers 126 function, in unison, to secure the grounding clip 110 to the mounting bracket 146. Specifically, the fingers 126 of the grounding clip 110 are resiliently biased such that when pressed into the mounting bracket 146 the fingers 126 flex and spring into a locking position wherein the mounting bracket 146 is retained within the alignment grooves. Additionally, the contact surface of the base 112 allows a secure fit of the grounding clip 110 on the mounting bracket 146.

As shown in FIG. 5, the grounding clip 110 also includes an eject port section 138 within aperture 118. The eject port section 138 is defined by one of the internal width portions and two of the fingers. In cases where the computer peripheral connector 100 is in the form of a PCMCIA connector, such a feature allows an eject button to be accessible by a user from outside the computer peripheral connector 100. As previously stated, the grounding clip 110 is designed such that it can be reversed (i.e., rotated 180°), thereby allowing use with PCMCIA cards having an eject button positioned on either the left side or right side thereof.

The present invention advantageously provides an ability to discharge peripheral cards such as PCMCIA cards and avoid damaging electronic circuitry of the host device receiving the peripheral card. This is accomplished by using the discharge surface of the fingers to direct any charge that has been built up on the peripheral card to a low impedance, high frequency point. The present invention enjoys such benefits without requiring numerous additional components that can otherwise increase manufacturing costs. During operation (i.e., insertion of a peripheral card), the peripheral card is inserted in a conventional manner. The surfaces of the peripheral card press against the fingers of the grounding clip as the card is being inserted. The resilient properties of the fingers maintain contact with the peripheral card to establish electrical communication with the discharge surfaces of the fingers. Hence, any charge built up on the peripheral card is directed to the low impedance, high frequency point. The present invention can also be constructed from various materials in order to provide the specific characteristics desired. Such materials include, but are in no way limited to: metallic conductors, copper alloys, and conductively filled polymers.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A grounding clip for a peripheral card comprising:
   a base having a contact surface and containing an aperture therethrough, said aperture being defined by an internal length portion and an internal width portion of said base, and said aperture being appropriately sized for receiving the peripheral card;
   at least one finger extending from one of the internal length portions of said base;
   wherein said at least one finger includes a discharge surface for contacting and grounding the peripheral card; and
   a pair of alignment tabs extending from the internal width portions of said base in a generally perpendicular orientation relative to said contact surface.

2. A grounding clip for a peripheral card comprising:
   a base having a contact surface and containing an aperture therethrough, said aperture being defined by an internal length portion and an internal width portion of said base, and said aperture being appropriately sized for receiving the peripheral card;
   at least one finger extending from one of the internal length portions of said base;
   wherein said at least one finger includes a discharge surface for contacting and grounding the peripheral card; and an eject port section within said aperture, said eject port section being defined by one of said internal width portions and two of said fingers.

3. A grounding clip for a peripheral card comprising:

a base having a contact surface and containing an aperture therethrough, said aperture being defined by an internal length portion and an internal width portion of said base, and said aperture being appropriately sized for receiving the peripheral card;

at least one finger extending from one of the internal length portions of said base;

wherein said at least one finger includes a discharge surface for contacting and grounding the peripheral card; and wherein each finger includes a first end connected to said base; and wherein said first end includes an alignment groove formed therein, said alignment groove being sized for receiving a mounting bracket therein and securing said grounding clip to the mounting bracket.

4. A grounding clip for a peripheral card comprising:

a base having a contact surface and containing an aperture therethrough, said aperture being defined by an internal length portion and an internal width portion of said base, and said aperture being appropriately sized for receiving the peripheral card;

at least one finger extending from one of the internal length portions of said base;

wherein said at least one finger includes a discharge surface for contacting and grounding the peripheral card; and wherein each finger includes an intermediate portion positioned at a prescribed angle relative to said base for placing said discharge surface in contact with the peripheral card.

5. The grounding clip of claim 4, wherein said prescribed angle is between about 120° to about 150°.

6. A grounding clip for a peripheral card comprising:

a base having a contact surface and containing an aperture therethrough, said aperture being defined by an internal length portion and an internal width portion of said base, and said aperture being appropriately sized for receiving the peripheral card;

at least one finger extending from one of the internal length portions of said base;

wherein said at least one finger includes a discharge surface for contacting and grounding the peripheral card; and wherein said plurality of fingers corresponds to a number of edge connectors on the peripheral card.

7. A grounding clip for a peripheral card comprising:

a base having a contact surface and containing an aperture therethrough, said aperture being defined by an internal length portion and an internal width portion of said base, and said aperture being appropriately sized for receiving the peripheral card;

at least one finger extending from one of the internal length portions of said base;

wherein said at least one finger includes a discharge surface for contacting and grounding the peripheral card; and wherein the peripheral card is a Personal Computer Memory Card International Association (PCMCIA) card, and said plurality of fingers is sixteen fingers.

8. A grounding clip for a peripheral card comprising:

a base having a contact surface and containing an aperture therethrough, said aperture being defined by an internal length portion and an internal width portion of said base, and said aperture being appropriately sized for receiving the peripheral card;

a pair of alignment tabs extending from the internal width portions of said base in a generally perpendicular orientation relative to said contact surface;

at least one pair of fingers extending from the internal length portions of said base, each corresponding finger of said at least one pair of fingers being disposed in registry along opposing internal length portions of said base;

each finger of said at least one pair of fingers including:

a first end connected to said base, said first end containing an alignment groove formed thereon for securing said grounding clip to a mounting bracket, and a second end having a curved portion containing a discharge surface thereon for contacting and grounding the peripheral card; and an eject port section within said aperture, said eject port section being defined by one of said internal width sections and a pair of said at least one pair of fingers.

9. A computer peripheral connector comprising:

a printed circuit board containing circuitry thereon;

a device connector operatively mounted on said printed circuit board;

a mounting bracket coupled to said printed circuit board and said device connector, said mounting bracket being referenced to a low impedance, high frequency ground; and a grounding clip attached to said mounting bracket, said grounding clip including:

a base having a contact surface and containing an aperture therethrough, said aperture being defined by an internal length portion and an internal width portion of said base, and said aperture being appropriately sized for receiving the peripheral card;

a pair of alignment tabs extending from the internal width portions of said base in a generally perpendicular orientation relative to said contact surface;

a plurality of fingers extending from the internal length portions of said base, said plurality of fingers being paired and disposed in registry along opposing internal length portions of said base;

each of said plurality of fingers including:

a first end connected to said base, said first end containing an alignment groove formed thereon for securing said grounding clip to said mounting bracket, and a second end having a curved portion containing a discharge surface thereon for contacting and grounding the peripheral card; and an eject port section within said aperture, said eject port section being defined by one of said internal width sections and two of said fingers.

* * * * *